United States Patent
Giovinazzi et al.

(10) Patent No.: US 7,869,268 B2
(45) Date of Patent: Jan. 11, 2011

(54) PHASE CHANGE MEMORY ERASABLE AND PROGRAMMABLE BY A ROW DECODER

(75) Inventors: Thierry Giovinazzi, Saint Maximin (FR); Francesco La Rosa, Rousset (FR)

(73) Assignee: STMicroelectronics SA, Montrouge (FR)

( * ) Notice: Subject to any disclaimer, the term of this patent is extended or adjusted under 35 U.S.C. 154(b) by 609 days.

(21) Appl. No.: 11/850,507

(22) Filed: Sep. 5, 2007

(65) Prior Publication Data
US 2008/0062752 A1   Mar. 13, 2008

(30) Foreign Application Priority Data
Sep. 5, 2006   (FR) ................................... 06 07744

(51) Int. Cl.
*G11C 11/00* (2006.01)
(52) U.S. Cl. ..................... 365/163; 365/148; 977/754
(58) Field of Classification Search ............... 365/46, 365/94, 100, 113, 129, 148, 163; 257/2–5, 257/296, E31.047, E27.006; 438/29, 95, 438/96, 166, 259, 365, 482, 486, 597; 977/754
See application file for complete search history.

(56) References Cited

U.S. PATENT DOCUMENTS

| | | | | |
|---|---|---|---|---|
| 4,272,833 A | 6/1981 | Taylor | ......................... | 365/210 |
| 6,862,213 B2* | 3/2005 | Hamaguchi | .................. | 365/158 |
| 6,995,999 B2* | 2/2006 | Morimoto | .................... | 365/148 |
| 7,050,328 B2 | 5/2006 | Khouri et al. | | |
| 2005/0117397 A1 | 6/2005 | Morimoto | .............. | 365/185.21 |
| 2005/0169093 A1* | 8/2005 | Choi et al. | ............. | 365/230.06 |
| 2005/0237820 A1* | 10/2005 | Takemura et al. | ...... | 365/189.05 |

* cited by examiner

*Primary Examiner*—Richard Elms
*Assistant Examiner*—Harry W Byrne
(74) *Attorney, Agent, or Firm*—Lisa K. Jorgenson; Robert Iannucci; Seed IP Law Group PLLC

(57) ABSTRACT

An integrated circuit includes a non-volatile memory having memory cells each having a memory point and a selection transistor having a control terminal connected to a word line, a row decoder for supplying word line selection signals, and at least one generator for supplying memory cells with an erase or programming voltage or current. Word line drivers are interposed between the row decoder and the word lines, and are arranged for applying to a word line selected by the row decoder control pulses, the profile of which corresponds to a profile of an erase or programming voltage or current pulse. Application is for particularly but not exclusively to phase change memories.

36 Claims, 9 Drawing Sheets

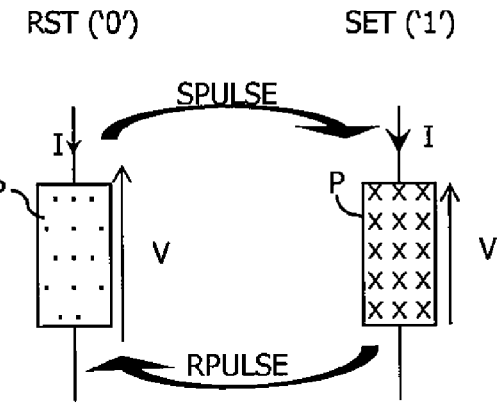
Fig. 2
(Prior art)
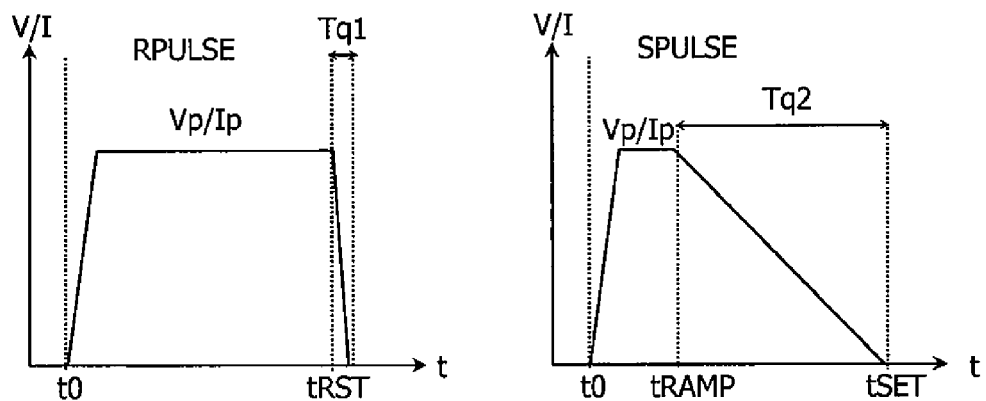
Fig. 3A
(Prior art)
Fig. 3B
(Prior art)

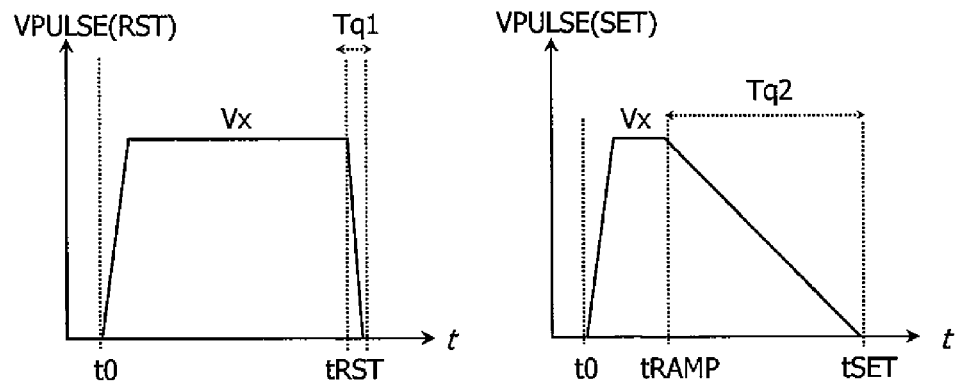
Fig. 6A  Fig. 6B
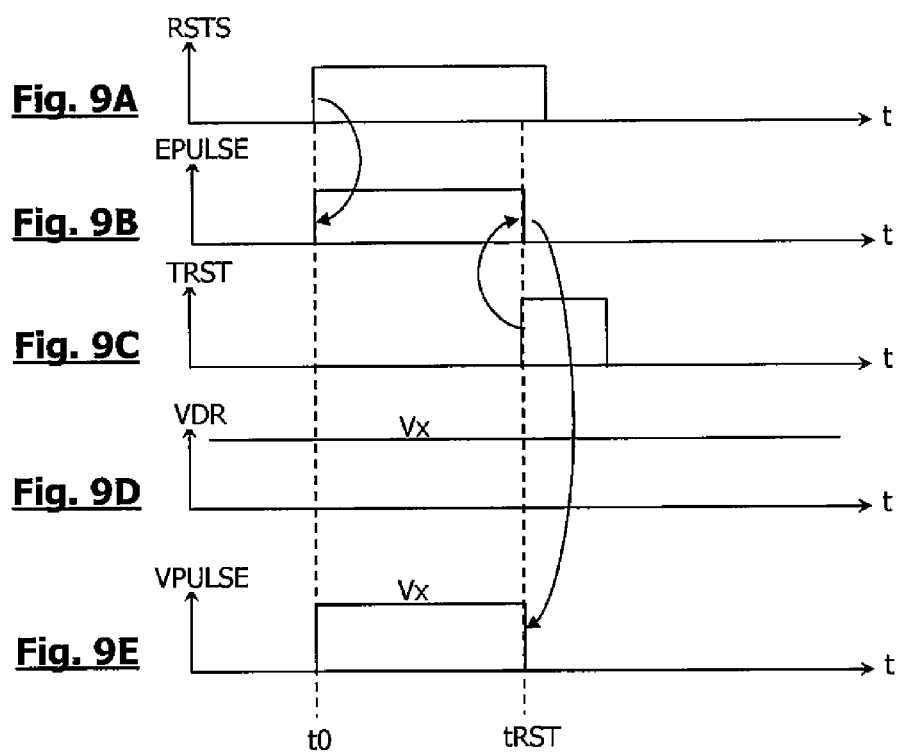
Fig. 9A
Fig. 9B
Fig. 9C
Fig. 9D
Fig. 9E

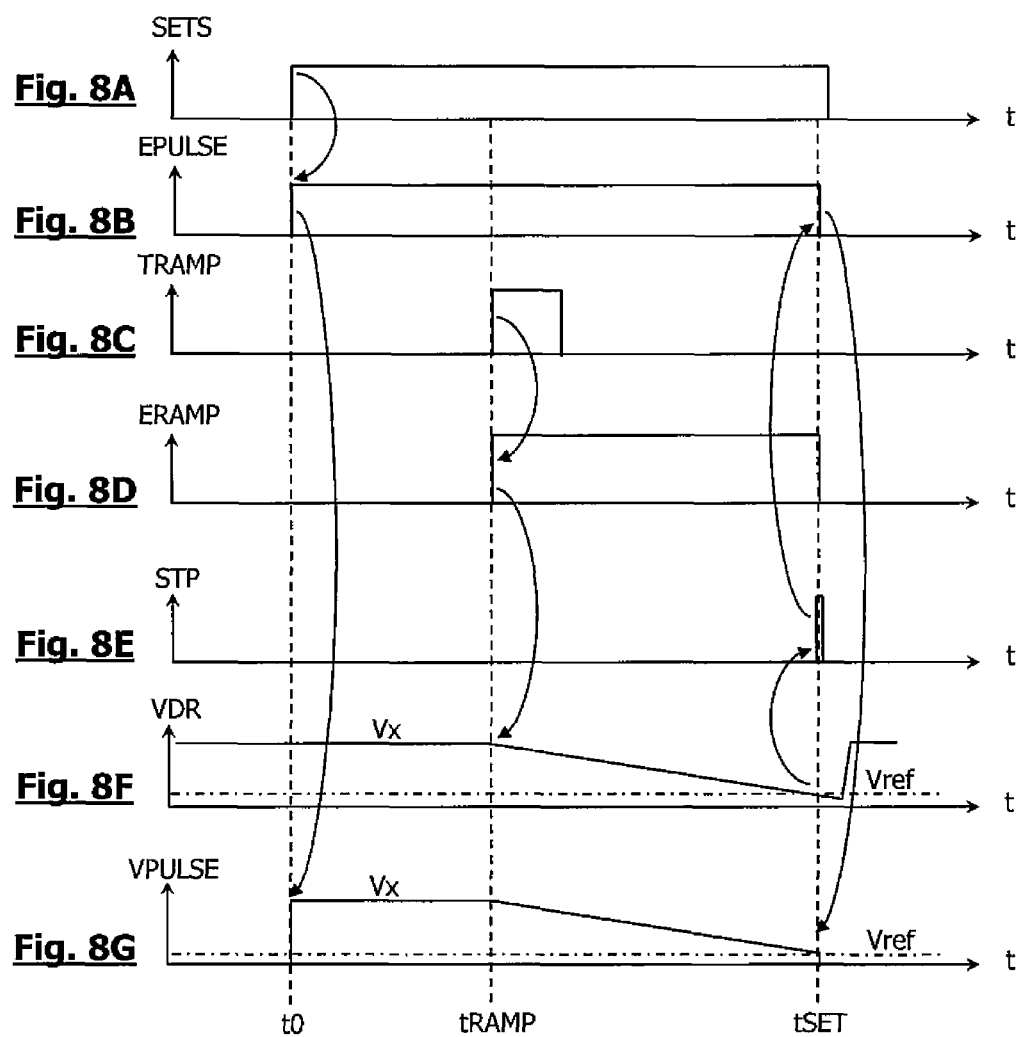

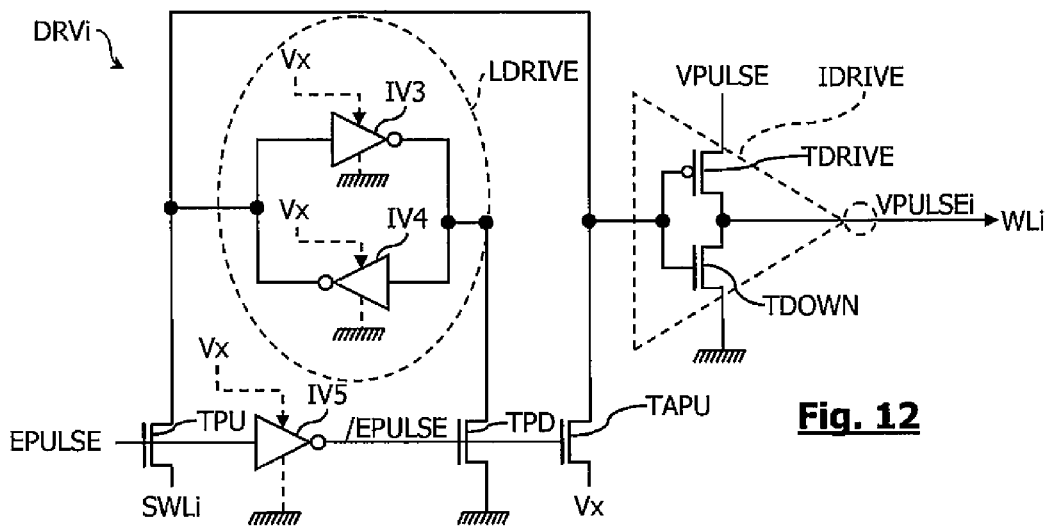
Fig. 12
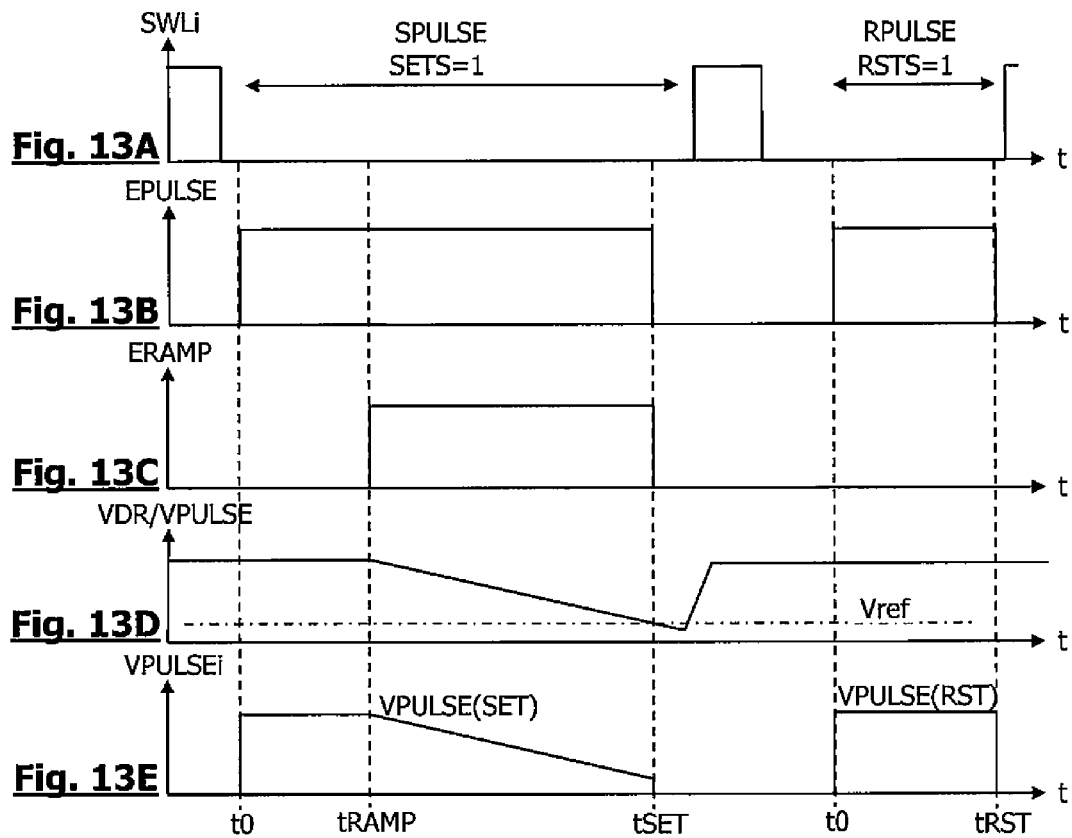
Fig. 13A
Fig. 13B
Fig. 13C
Fig. 13D
Fig. 13E

PHASE CHANGE MEMORY ERASABLE AND PROGRAMMABLE BY A ROW DECODER

TECHNICAL FIELD

The present disclosure generally relates to the field of electrically programmable and erasable non-volatile memories and particularly but not exclusively to memories comprising phase change memory cells (PCM).

BACKGROUND INFORMATION

Phase change memory points comprise of a material which can change physical state under the effect of an electric signal, and more precisely under the effect of a temperature rise caused by a voltage and an electric current (Joule effect). This state change is remanent and comes with a change in the electrical properties of the memory point. In a first so-called amorphous phase, the material has a high electrical resistivity, and in a second so-called crystalline phase the material has a low electrical resistivity.

Progress made in the compositions of phase change materials, for example chemical element-based alloys in column VI of the Mendeleyev table, such as tellurium Te or selenium Se, are such that the phase change can be obtained with a voltage of a few volts and a current of a few hundred microamperes only, which enables phase change memory points to be integrated into the memories implanted onto semiconductor chips.

As an example, FIG. 1 represents the architecture of a memory array MA of the type described by EP 1 450 373. The memory array MA comprises memory cells CELi,j,k arranged as a matrix and each linked to a word line WLi of rank i and to a bit line BLjk of rank j (j ranging from 0 to m) belonging to a column COLk of rank k. Each memory cell CELi,j,k comprises a selection switch TS, for example an NMOS transistor, and a phase change memory point P. The anode of the memory point P is linked to a bit line BLjk and its cathode is linked through the transistor TS to a low potential or to a line switchable to a low potential, for example the ground. The gate terminal of the transistor TS is linked to a word line WLi.

As shown in FIG. 2, the memory point P has two stable states SET and RST (short for "RESET") corresponding to the two abovementioned types of resistivity. In the state SET which corresponds for example to the storing of a logic "1", the memory point has a first series resistance, for example 5 to 10 K ohms, while in the state RST corresponding to the storing of a logic "0", the memory point has a second series resistance, for example 100 to 200 K ohms.

By analogy with electrically erasable and programmable memories using floating-gate transistors, the state SET will be called "programmed state" and the state RST will be called "erased state". The change from the programmed state to the erased state is ensured by applying to the memory point a pulse RPULSE of the type represented in FIG. 3B, having a plateau of a duration tRST of a few dozen nanoseconds, for example 100 nanoseconds, and a quench time Tq1 ("Tquench") as fast as possible, which does not in practice exceed a few nanoseconds. The pulse RPULSE is voltage- or current-controlled and has a maximal voltage Vp of a few volts and a maximal current Ip of a few hundred microamperes, which cause a warming by Joule effect rendering the material amorphous.

The change from the erased state to the programmed state is ensured by applying to the memory point a pulse SPULSE of the type represented in FIG. 3B, of a duration tSET. The pulse has a plateau of a few dozen nanoseconds, for example 50 nanoseconds, and a quench time Tq2 that is quite long, for example 300 nanoseconds. Thus the pulse SPULSE has a decreasing ramp from an instant tRAMP calculated as of the instant to of it being sent, the duration of the ramp being equal to tSET-tRAMP. The pulse SPULSE is also voltage- or current-controlled and has a maximal voltage Vp of a few volts and a maximal current Ip of a few hundred microamperes, followed by the decreasing voltage or current ramp the effect of which is to recrystallize the material.

In summary, the quench time Tq2 of the pulse SPULSE is quite long while on the contrary the quench time Tq1 of the pulse RPULSE is very short to prevent the recrystallization.

Reading the memory point P then makes it possible to determine whether the latter has the first or the second series resistance, and a binary value 1 or 0 is associated with the resistance value read. Such a reading is generally done under a low voltage so as not to modify the state of the memory point by causing spurious erasing or programming. A low-value read voltage, for example 0.5 V, is sufficient to read the memory point while being sufficiently low so as not to cause a change in the programmed or erased state of the memory point.

The integration of phase change memory points into a memory produced on a semiconductor substrate is an objective for this memory technology to be industrially used, due to the low cost price of the integrated circuits. For this purpose, the means for controlling the memory cells, mainly the erase and programming means, are produced in a rational and inexpensive manner and little cumbersome in terms of semiconductor surface.

For a better understanding of the erase and programming solutions provided in prior art, FIG. 4 represents a classic architecture of phase change memory of the type described by the application EP 1 450 373. The memory represented comprises a memory array MA and memory cells of the type described above. The memory also comprises a column selection circuit CSEL1 connected to the bit lines BL (BL0k, . . . BLjk, . . . BLmk). The selection circuit CSEL1 comprises bit line (BK0k, . . . BKjk, . . . BKmk) selection blocks BK with one block per bit line. Each selection block BK comprises PMOS-type transistors TP1, TP2 and an NMOS-type transistor TN1 in series. These transistors are controlled by selection signals YMk, YNk, YOk supplied by a column decoder CDEC1.

During memory cell erasing or programming phases, the pulses RPULSE or SPULSE are supplied by writing circuits WRCT (WRCT0, . . . WRCTj, . . . WRCTm). The pulses RPULSE or SPULSE are applied to the bit lines through isolation transistors TIW, a multiplexing bus BMUX and the selection blocks BK. For this purpose, the isolation transistors TIW are put into the on state by a gate signal YW, the signals YM and YN are set to 0 (ground of the circuit) and the signal YO is taken to a gate voltage of high value so that the voltage Vp or the current Ip is transferred without loss. Simultaneously, a row decoder RDEC applies to a word line WLi a selection signal SWLi which biases the gates of the selection transistors TS for selecting the memory cells connected to this word line, and puts these transistors into the on state.

This erasing/programming method has the disadvantage of being relatively complex to implement. In particular, the writing circuits WRCT are complex to produce because the profile and the duration of the pulses RPULSE or SPULSE must be controlled with great precision, in particular the quench times Tq1 and Tq2.

BRIEF SUMMARY

Therefore, one embodiment of the present invention provides a method for applying to memory cells in a simple manner voltage or current pulses having certain durations, profiles and quench times.

The present invention also aims to provide a memory comprising means for implementing this method.

For this purpose, one embodiment of the present invention provides an integrated circuit comprising a non-volatile memory comprising memory cells each including a memory point and a selection transistor having a control terminal connected to a word line, a row decoder for supplying word line selection signals, at least one voltage or current generator for supplying memory cells with an erase or programming voltage or current, and word line drivers interposed between the row decoder and the word lines, arranged for applying to a word line selected by the row decoder control pulses the profile of which corresponds to a profile of an erase or programming current or voltage pulse to be applied to memory points, and thus controlling by the selection transistors the amplitude and the duration of the erase or programming voltage or current applied to the memory points.

According to one embodiment, the integrated circuit comprises a control circuit supplying the word line drivers with a first control signal the profile of which determines the profile of the control pulses.

According to one embodiment, the control circuit comprises a ramp generator for giving a control pulse a profile comprising a voltage ramp.

According to one embodiment, the word line drivers each comprise a pull-down switch designed to rapidly pull a selected word line down to the low level, at the end of a control pulse, by discharging a stray capacitance of the word line.

According to one embodiment, the pull-down switch of a word line driver is designed to pull the word line down to a low level in a few nanoseconds after the word line has been biased with a maximal voltage that the word line driver can apply.

According to one embodiment, the integrated circuit comprises a control circuit supplying the word line drivers with a second control signal indicating the end of a control pulse.

According to one embodiment, the integrated circuit comprises a control circuit supplying the word line drivers with a second control signal indicating the beginning and the end of a control pulse.

According to one embodiment, the pull-down switch is controlled by the second control signal, so as to pull the word line down to the low level when the second control signal indicates that a control pulse has ended.

According to one embodiment, the word line drivers are arranged for applying to a word line a control pulse when the word line decoder supplies a signal for selecting the word line and when the beginning of a control pulse is indicated by the second control signal.

According to one embodiment, the pull-down switch of a word line driver is the pull-down transistor of an inverter gate comprising a pull-up transistor to apply a control pulse to the word line concerned.

According to one embodiment, the input of the inverter gate is controlled by the second control signal, so as to pull the word line down to a low level when the second control signal indicates that a control pulse has ended.

According to one embodiment, the input of the inverter gate is controlled by the second control signal and a word line selection signal, so as to: apply to the word line concerned a control pulse when the second control signal indicates the beginning of a pulse and the word line selection signal indicates that the word line is selected, and pull the word line down to a low level when the second control signal indicates that the control pulse has ended.

According to one embodiment, the word line drivers each comprise a pull-up switch to speed up the change of the input of the inverter gate to the high state when the second control signal indicates that a control pulse has ended.

According to one embodiment, the control circuit comprises an isolating switch arranged between an output node of the control circuit and the word line drivers, and the isolating switch is opened by the control circuit at the end of a control pulse, so as to isolate the output node of the control circuit in relation to the word line drivers.

According to one embodiment, the memory point of a memory cell is a phase change memory point.

According to one embodiment, the memory point of a memory cell is connected to a bit line through which it receives the erase or programming voltage or current, and is linked to a low potential through the selection transistor for selecting the memory cell.

According to one embodiment, the memory cell selection transistor is a MOS transistor.

An embodiment of the present invention also relates to a method for controlling the application of erase or programming voltage or current pulses to memory cells each including a memory point and a selection transistor having a control terminal connected to a word line, the method comprising applying an erase or programming voltage or current to the memory cells, and applying to the word line the control pulses the profile of which corresponds to a profile of an erase or programming voltage or current pulse to be applied to memory points, so as to control by the selection transistors the amplitude and the duration of the erase or programming voltage or current applied to the memory points.

According to one embodiment, the method comprises controlling the profile of the control pulses with a ramp generator, to give control pulses a profile comprising a voltage ramp.

According to one embodiment, the method comprises: providing a pull-down switch designed to rapidly pull the word line down to the low level at the end of a control pulse, by discharging a stray capacitance of the word line, and putting the pull-down switch into the on state at the end of a control pulse.

According to one embodiment, the pull-down switch is designed to pull the word line down to a low level in a few nanoseconds once the word line has been biased with a voltage.

According to one embodiment, the method comprises: providing a word line driver to apply the control pulses to the word line, arranging the pull-down switch in the word line driver, and supplying the word line driver with a control signal indicating the end of a control pulse and causing the pull-down switch to close.

According to one embodiment, the method comprises providing in the word line driver an inverter gate comprising the pull-down transistor and a pull-up transistor to apply the control pulses to the word line concerned.

According to one embodiment, the method comprises controlling the input of the inverter gate by the control signal and a selection signal for selecting the word line, so as to: apply a control pulse to the word line when the control signal indicates the beginning of a pulse and the selection signal indicates that the word line is selected, and pull the word line down to a low level when the control signal indicates that the control pulse has ended.

According to one embodiment, the memory point of a memory cell is a phase change memory point.

According to one embodiment, the memory cell selection transistor is a MOS transistor.

BRIEF DESCRIPTION OF THE SEVERAL VIEWS OF THE DRAWINGS

These and other features will be explained in greater detail in the following description of examples of embodiments of a memory according to the present invention, given in relation with, but not limited to the following figures, in which:

FIGS. 9A to 9E represent electric signals appearing in the control circuit during periods of erasing memory cells according to an embodiment, FIG. 12 is the wiring diagram of an embodiment of a word line driver represented in block form in FIGS. 5 and 7, and FIGS. 13A to 13E represent electric signals appearing in the word line driver according to an embodiment.

DETAILED DESCRIPTION

In the following description, numerous specific details are given to provide a thorough understanding of embodiments. One skilled in the relevant art will recognize, however, that the invention can be practiced without one or more of the specific details, or with other methods, components, materials, etc. In other instances, well-known structures, materials, or operations are not shown or described in detail to avoid obscuring aspects of the invention.

Reference throughout this specification to "one embodiment" or "an embodiment" means that a particular feature, structure, or characteristic described in connection with the embodiment is included in at least one embodiment. Thus, the appearances of the phrases "in one embodiment" or "in an embodiment" in various places throughout this specification are not necessarily all referring to the same embodiment.

Furthermore, the particular features, structures, or characteristics may be combined in any suitable manner in one or more embodiments.

The headings provided herein are for convenience only and do not interpret the scope or meaning of the embodiments.

Figure 5:
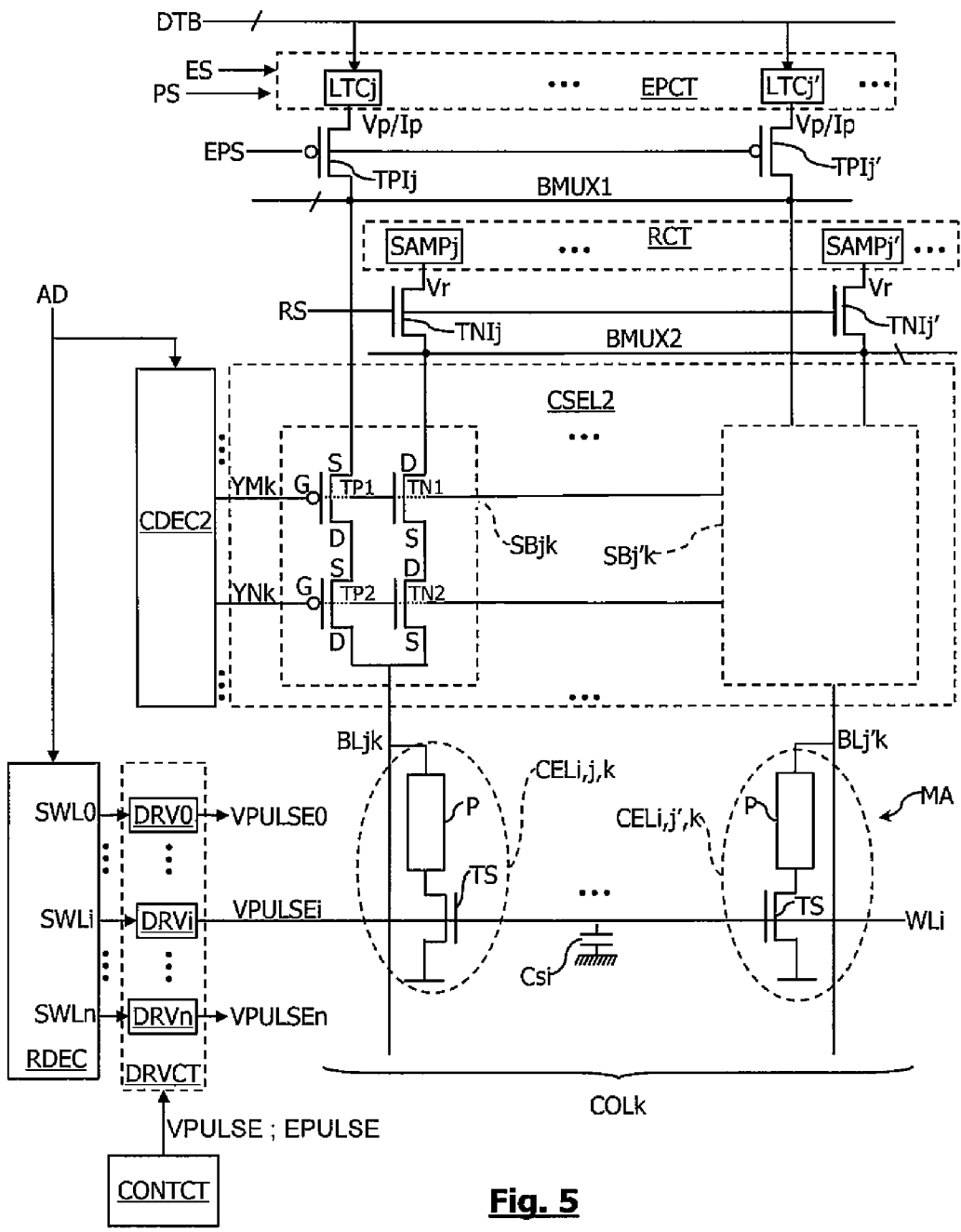

FIG. 5 schematically represents a memory architecture according to one embodiment of the present invention. The memory described here as an example of an embodiment of the present invention is a word-erasable and -programmable memory in which the number of bits per word is defined by the number of bit lines contained in a column. However, as it will be specified below, and in accordance with the common rules of architecture of memories, one embodiment of the present invention can also be applied to a bit-erasable and programmable memory in which the notion of column is not implemented (i.e., in which one column corresponds to one and only one bit line).

Figure 1:
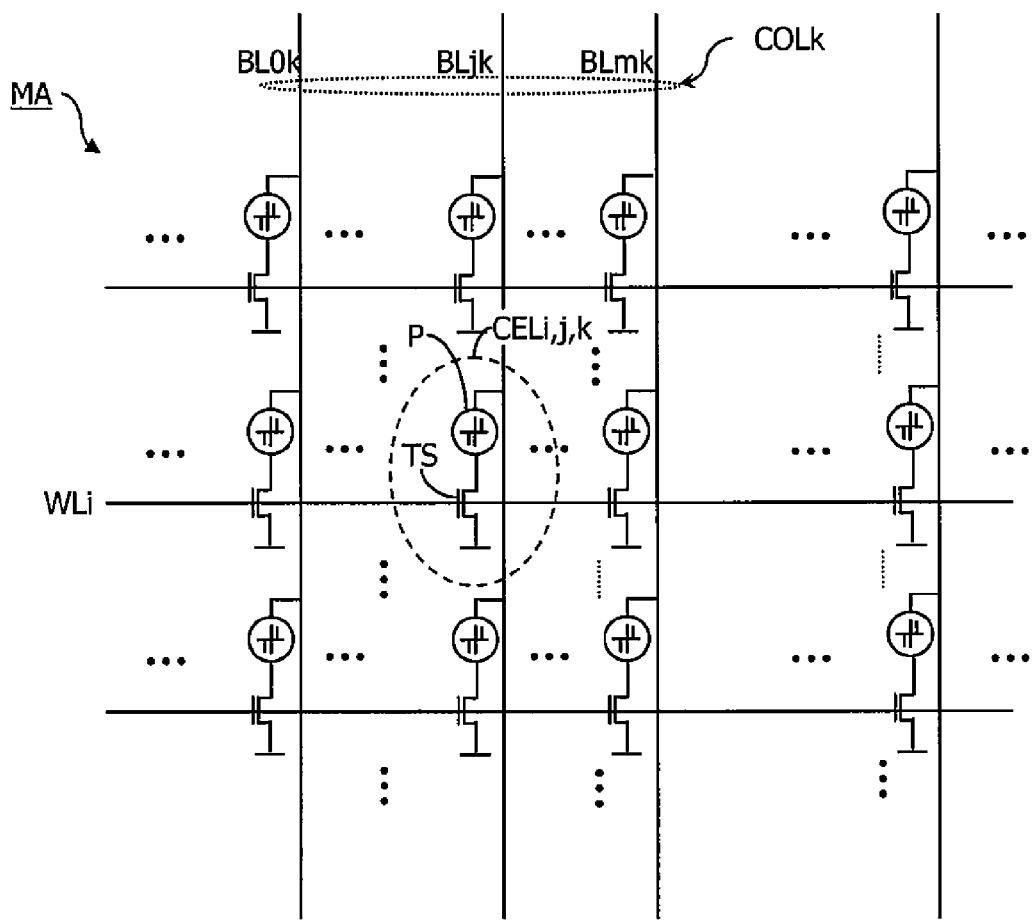
FIG. 1 described above represents a memory array comprising phase change memory cells, FIG. 2 described above represents a phase change memory point in the erased state and in the programmed state, FIGS. 3A and 3B described above respectively represent an erase pulse and a programming pulse applied to a memory point, FIG. 4 described above schematically represents a classic phase change memory architecture, FIG. 5 schematically represents a phase change memory architecture according to one embodiment of the present invention, FIGS. 6A and 6B respectively represent an erase control pulse and a programming control pulse according to one embodiment of the present invention.
Figure 4:
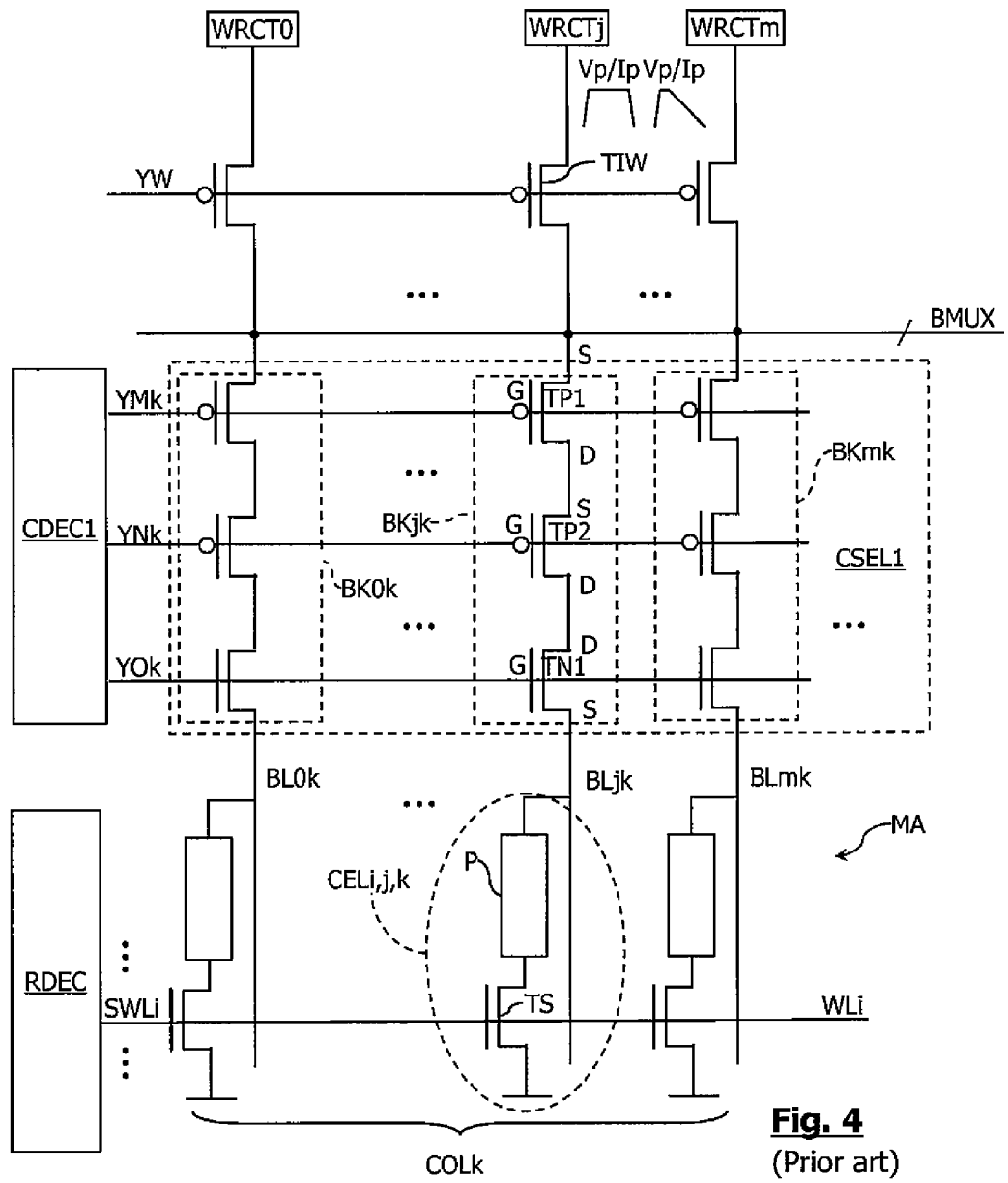

The memory comprises a memory array MA of the same type as the one represented in FIG. 1. For the sake of readability of the figure, only the following elements of the memory array are represented:

a word line WL of rank i (WLi),
two bit lines BL of rank j and j' (BLjk, BLj'k) belonging to a column COL of rank k (COLk), each column comprising m bit lines and defining words of m bits (m being equal to 1 in the case of a bit-erasable and -programmable memory), and
two memory cells CEL (CELi,j,k, CELi,j'k) respectively connected to the bit line BLjk and to the bit line BLj'k, and both connected to the word line WLi, and
various elements of rank i, j, j', or k described below, linked to the word line WLi or to the bit lines BLjk, BLj'k.

Each memory cell of the memory array MA comprises a selection transistor TS and a phase change memory point P. The memory point P is linked through the transistor TS to a low potential, or to a line switchable to a low potential, the low potential preferentially being the ground of the circuit. The transistors TS are here NMOS transistors, but bipolar transistors could also be used and generally speaking any type of switch having a control terminal allowing a progressive control of the conductivity of the switch.

The memory also comprises a row decoder RDEC, a column decoder CDEC2, a column selection circuit CSEL2, a read circuit RCT and an erase or programming circuit EPCT. The decoder RDEC and the decoder CDEC2 respectively receive the most and least significant bits of an address AD of a memory word to be selected (word of 8 memory cells or more according to the number of bit lines per column). The decoder RDEC supplies selection signals SWL (SWL0, . . . SWLi, . . . SWLn) for selecting the word lines WL. The decoder CDEC2 supplies column selection signals YM, YN with two selection signals (YMk, YNk) per column of rank k (COLk).

The circuit EPCT comprises erase or programming latches LTC (LTCj, LTCj') which each supply an erase or programming signal Vp/Ip. As the erasing or programming of a memory cell can be done classically by controlling the voltage or by controlling the current applied to the memory cell, the signal Vp/Ip can have a constant voltage Vp or a constant current Ip, depending on whether it is voltage- or current-controlled.

The latches LTC receive data through a data bus DTB with one datum (bit) per latch, and are activated by a distinct erase signal ES and a distinct programming signal PS. Therefore, a latch LTC delivers the erase or programming signal Vp/Ip when the erase signal ES has an active value (for example 1) and when it simultaneously receives a bit on 0 at a data input.

Similarly a latch LTC delivers the erase or programming signal Vp/Ip when the programming signal PS has an active value and when it simultaneously receives a bit on 1 at its data input.

The read circuit RCT comprises sense amplifiers SAMP (SAMPj, SAMPj') supplying a low-value read voltage Vr, for example in the order of 0.5 V as indicated above.

Each latch LTC (LTCj, LTCj') is linked to bit lines through a PMOS-type isolation transistor TPI (TPIj, TPIj'), a multiplexing bus BMUX1, and the column selection circuit CSEL2. Each sense amplifier SAMP (SAMPj, SAMPj') is linked to bit lines through an NMOS-type isolation transistor TNI (TNIj, TNIj'), a multiplexing bus BMUX2 and the column selection circuit CSEL2.

The selection circuit CSEL2 comprises one selection block SB (SBjk, SBj'k) for each bit line BL (BLjk, BLj'k). The bit line selection blocks belonging to a same column COLk (for example the blocks SBjk, SBj'k represented) receive the same selection signals YM, YN (for example the signals represented YMk, YNk).

Each selection block SB here comprises two selection sub-blocks PSB and NSB. Each sub-block NSB here comprises two NMOS transistors TN1, TN2 in series and each sub-block PSB comprises two PMOS transistors TP1, TP2 in series. The sub-blocks NSB, PSB of a same selection block are arranged in parallel, the sub-block NSB linking the bit line concerned to the corresponding latch, and the sub-block NSB linking the bit line concerned to the corresponding sense amplifier. The sub-blocks NSB, PSB of a same selection block are controlled here by the same signals. Thus, the transistors TN1 and TP1 receive the signal YM at their gate terminal and the transistors TN2 and TP2 receive the signal YN at their gate terminal.

In summary, each bit line is linked to an erase or programming latch LTC supplying an erase or programming signal Vp/Ip of fixed value, by an electrical path comprising for example only PMOS transistors, here the two transistors of a selection sub-block PSB and an isolation transistor TPI. Similarly, each bit line is linked to a sense amplifier SAMP by an electrical path comprising for example only NMOS transistors, here two transistors of a selection sub-block NSB and an isolation transistor TNI. Such an architecture of the column selection circuit CSEL2, although optional within the scope of an embodiment of the present invention, enables the signal Vp/Ip to be transferred to the selected bit lines without any loss of voltage in the various transistors, and by applying only low-voltage signals to the gate terminals of these transistors.

According to one embodiment of the present invention, the latches LTC do not supply the erase RPULSE or programming SPULSE pulses described above. The latches merely supply a signal Vp/Ip of fixed value and this signal is modulated by the transistors TS of the memory cells, in a manner described below. The result is that the structure of the latches is very simple. These latches are simple voltage or current selector switches of a type known per se and are for example used in prior art to apply a high programming voltage Vpp to the bit lines in EEPROM or FLASH memories comprising floating-gate transistors. Moreover, if the erase or programming signal Vp/Ip is voltage-controlled, the voltage Vp the latches must supply is here a voltage in the order of 6 volts, much lower than the voltage Vpp of the EEPROM or FLASH memories which is in the order of 10 to 15 V. No high voltage transistor is therefore even necessary to produce the latches.

Furthermore, if a bit-erasable and -programmable memory is chosen to be produced, these latches are not necessary at all. In this case, the erase or programming signal Vp/Ip is applied simultaneously to all the isolation transistors TPI by a single selector switch for the entire memory array.

One or more embodiments according to the present invention will now be described which enable the erase or programming pulses RPULSE and SPULSE represented in FIGS. 3A, 3B to be applied to the memory cells, while the latches LTC are supplying an erase or programming signal Vp/Ip of constant value, or while all the isolation transistors TPI are simultaneously receiving the signal Vp/Ip (in the case of a bit-erasable and -programmable memory).

According to an embodiment of the present invention, an erase- or program-selected word line WL, for example the line WLi represented, receives control pulses VPULSE (VPULSEi) equal to VPULSE(RST) or to VPULSE(SET), which drive the gate terminals of the selection transistors TS for selecting the memory cells connected to this word line. These control pulses act on the conductivity of the transistors TS and enable the voltage or the current which passes through the memory points P to be modulated. The shape of these control pulses is schematically represented in FIGS. 6A, 6B.

The control pulse VPULSE(RST) represented in FIG. 6A is a voltage pulse of value Vx, of a profile substantially similar to that of the pulse RPULSE represented in FIG. 3A. This pulse is used to control the selection transistors TS during a phase of erasing memory cells. In particular, it has a duration tRST identical to the desired duration of the signal RPULSE, and is followed by a very steep falling edge of duration Tq1 in the order of a few nanoseconds.

Similarly, the control pulse VPULSE(SET) represented in FIG. 6B is a voltage pulse of a profile substantially similar to that of the signal SPULSE represented in FIG. 3B and is used to control the selection transistors TS during a phase of programming memory cells. This pulse of duration tSET has a plateau of value Vx and of duration tRAMP in the order of 50 nanoseconds, followed by a low-slope falling edge ranging from Vx to zero, of a duration Tq2 equal to tSET-tRAMP, for example 300 nanoseconds.

For this purpose, and as represented in FIG. 5, a driver circuit DRVCT is interposed between the row decoder RDEC and the memory array MA. The circuit DRVCT comprises word line drivers DRV with one driver per word line. These drivers are referenced DRV0, ... DRVi, ... DRVn in FIG. 5 assuming that the memory array comprises n+1 word lines WL. They each receive a control signal VPULSE supplied by a control circuit CONTCT and are arranged between the word line decoder RDEC and the word line to which they are allocated. The decoder RDEC applies the selection signals SWL (SWL0, ... SWLi, ... SWLn) to them instead of applying these signals to the word lines.

According to one optional but advantageous aspect of an embodiment of the present invention, the circuit CONTCT also supplies the drivers DRV with a synchronization signal EPULSE enabling them to find out the instant at which a control pulse VPULSE(RST) or VPULSE(SET) ends. As will be seen below, this synchronization signal particularly enables the word line drivers to themselves pull down to the low potential (here the ground) the word lines having received the voltage Vx, by rapidly discharging stray capacitances Cs (Csi) present on these word lines. In other words, the word lines are set to 0 by the drivers themselves, rather than by the circuit CONTCT, and this enables a very steep falling edge Tq1 to be obtained at the end of the pulse VPULSE(RST).

Figure 7:
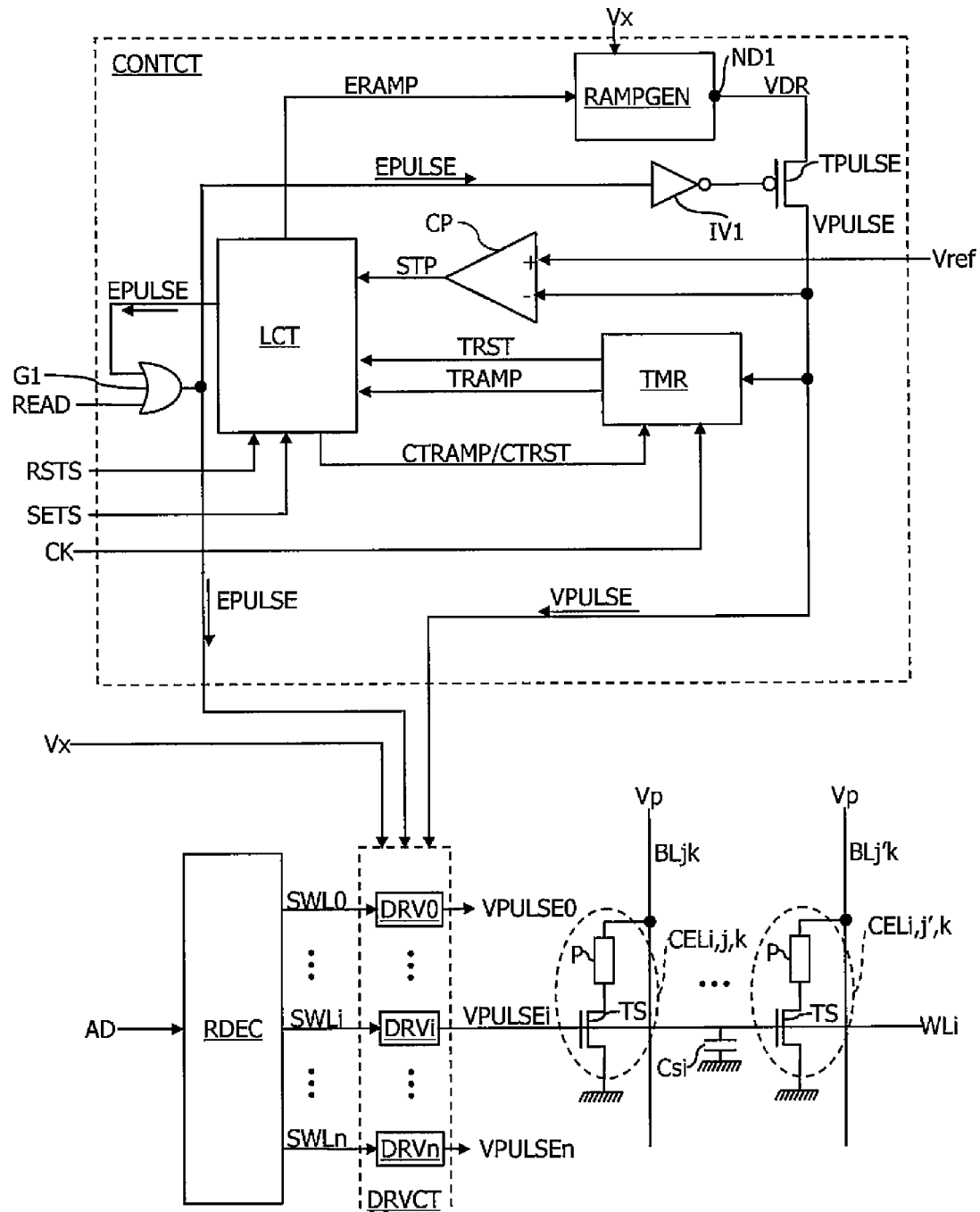
FIG. 7 represents in greater detail an embodiment of a control circuit represented in block form in FIG. 5, FIGS. 8A to 8G represent electric signals appearing in the control circuit during periods of programming memory cells according to an embodiment.

FIG. 7 represents an example of an embodiment of the circuit CONTCT. The latter comprises a logic control circuit LCT, an "OR"-type gate G1, an inverter gate IV1, a ramp generator RAMPGEN electrically powered by the voltage Vx, a timer TMR paced by a clock signal CK, a comparator CP and, optionally, an output transistor TPULSE, here of PMOS type. The transistor TPULSE has its source terminal connected to an output node ND1 of the generator RAMPGEN, and its drain terminal supplies the control signal VPULSE.

The circuit LCT receives two external command signals RSTS and SETS respectively indicating that an erase VPULSE(RST) or programming VPULSE(SET) pulse must be applied to word lines. Upon receiving one of these commands, the circuit LCT supplies the signal EPULSE ("Enable Pulse") which is here equal to 1 throughout the duration of the pulse. The signal EPULSE is sent to the drivers DRV through the gate G1, which receives a READ signal at another input. This READ signal enables the signal EPULSE to be forced to 1 during reading phases, so as to force the drivers into the on state during the reading of memory cells. The signal EPULSE is also applied to the generator RAMPGEN and is applied to the gate terminal of the transistor TPULSE through the inverter gate IV1, such that the transistor TPULSE becomes on when the signal EPULSE is equal to 1.

The generator RAMPGEN supplies at the output node ND1 a voltage VDR which is equal to the voltage Vx while the circuit LCT does not set an ERAMP signal ("Enable Ramp") to 1. When the signal ERAMP changes to 1, the voltage VDR decreases and tends towards 0 with a slope that is adjusted so that the change from Vx to 0 corresponds substantially to the quench time Tq2 of a pulse SPULSE (FIG. 3B), e.g., the difference between the instant tSET and the instant tRAMP (FIGS. 3B and 6B).

The comparator CP receives a reference voltage Vref at a positive input and its negative input is connected to the node ND1 or to the drain terminal of the transistor TPULSE. It supplies the circuit LCT with a pulse stop signal STP when the level of the voltage VDR becomes lower than Vref.

The timer TMR determines the instants tRAMP and tRST, e.g., respectively the instant at which a decreasing voltage ramp must be produced by the circuit PULSCT after the start of the pulse VPULSE(SET), and the instant at which a pulse VPULSE(RST) must end. For this purpose, the timer receives from the circuit LCT two signals CTRAMP and CTRST indicating thereto which of the two times is to be calculated. The activation of the timer is triggered by the signal VPULSE, when the latter changes from 0 to the voltage Vx at the drain terminal of the transistor TPULSE. When the instant tRAMP is reached the timer supplies the circuit LCT with a signal TRAMP equal to 1. When the instant tRST is reached the timer supplies the circuit LCT with a signal TRST equal to 1.

The operation of the circuit CONTCT in response to the signal SETS is shown by FIGS. 8A to 8G which respectively represent the signals SETS, EPULSE, TRAMP, ERAMP, STP, the voltage VDR and the signal VPULSE. At an instant t0 the signal SETS is set to 1 (FIG. 8A) and the circuit LCT sets the signal EPULSE to 1 (FIG. 8B). The transistor TPULSE becomes on and the signal VPULSE becomes equal to VDR, i.e. equal to the voltage Vx (FIG. 8G), as the voltage VDR has been previously stabilized (FIG. 8F) by applying the voltage Vx to the generator RAMPGEN. At the instant tRAMP, the timer TMR sets the signal TRAMP to 1 (FIG. 8C) and the circuit LCT sets the signal ERAMP to 1 (FIG. 5D). The voltage VDR and the signal VPULSE start to decrease (FIGS. 8F and 8G). At the instant tSET, the level of the voltage VDR and that of the signal VPULSE become substantially lower than Vref (FIG. 8G) and the comparator CP sets the stop signal STP to 1 (FIG. 8E). The circuit LCT then sets the signal EPULSE to 0 (FIG. 8B) and the transistor TPULSE turns off, such that its drain terminal changes to the high impedance state. Almost simultaneously but for the reaction time of the generator RAMPGEN, the voltage VDR rises up to the voltage level Vx, such that the output node ND1 is precharged and ready to supply the voltage Vx again.

The operation of the circuit CONTCT in response to the signal RSTS is shown by FIGS. 9A to 9E (below FIGS. 6A, 6B) which respectively represent the signals RSTS, EPULSE, TRST, the voltage VDR and the signal VPULSE. At an instant to the signal RSTS is set to 1 (FIG. 9A) and the circuit LCT sets the signal EPULSE to 1 (FIG. 9B). The transistor TPULSE becomes on and the signal VPULSE becomes equal to VDR, e.g., equal to the voltage Vx (FIG. 9E), as the voltage VDR has previously been stabilized (FIG. 9D) by applying the voltage Vx to the generator RAMPGEN. At the instant tRST, the timer TMR sets the signal TRST to 1 (FIG. 9C) and the circuit LCT then sets the signal EPULSE to 0 (FIG. 9B). The transistor TPULSE turns off, such that the drain of this transistor changes to the high impedance state. The voltage VDR remains equal to Vx, such that the output node ND1 of the generator remains precharged to supply the voltage Vx again.

As mentioned above, the very short quench time Tq1 of the pulse VPULSE(RST) (FIG. 6A) is not controlled by the circuit CONTCT the output of which changes here to high impedance, and this control is done locally by the word line drivers DRV, in a manner that will be described below.

Figure 10:
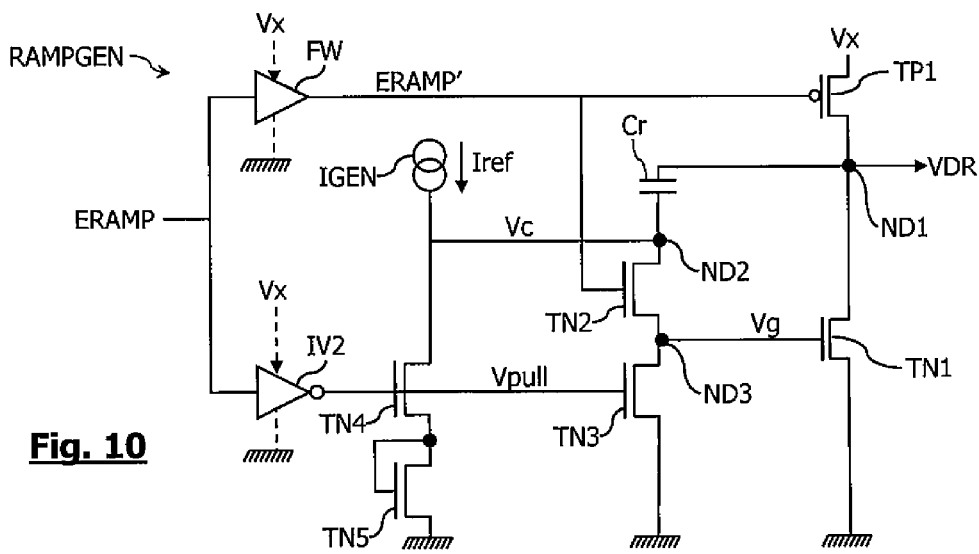
FIG. 10 is the wiring diagram of an embodiment of a ramp generator represented in block form in FIG. 7, FIGS. 11A to 11E represent electric signals appearing in the ramp generator according to an embodiment.
Figure 11A:
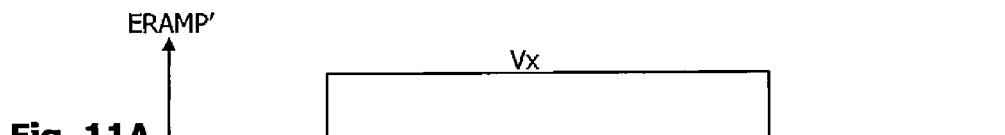
Figure 11B:
Figure 11C:
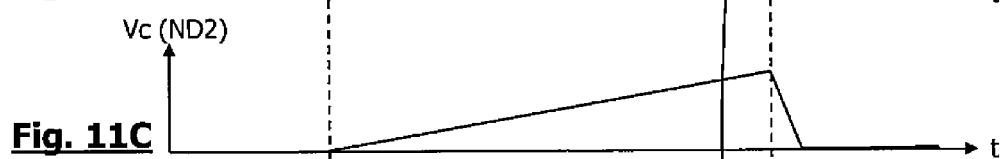
Figure 11D:
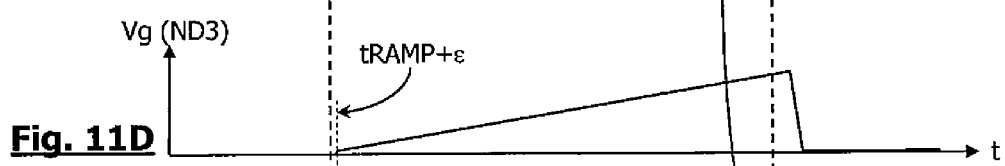
Figure 11E:
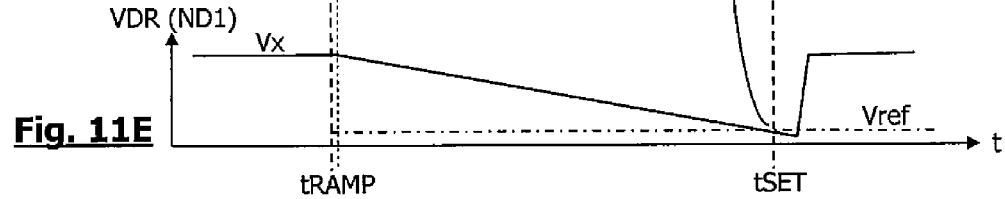

FIG. 10 represents an example of embodiment of the ramp generator RAMPGEN. The latter comprises a PMOS-type transistor TP1, NMOS-type transistors TN1, TN2, TN3, TN4, TN5, a follower FW and an inverter gate IV2 which are electrically powered by the voltage Vx, a current generator IGEN supplying a current Iref and a ramp capacitor Cr. The source terminal of the transistor TP1 receives the voltage Vx, the drain terminal of this transistor is connected to that of the transistor TNI at a point forming the output node ND1 of the generator, supplying the voltage VDR. The source terminal of the transistor TN1 is connected to the ground. The anode of the capacitor Cr is connected to the node ND1, and the cathode of the capacitor Cr is connected to the drain terminal of the transistor TN2, in a node ND2 of voltage Vc. The source terminal of the transistor TN2 is connected to the drain terminal of the transistor TN3 in a node ND3 of voltage Vg, the source terminal of the transistor TN3 being connected to the ground. The drain terminal of the transistor TN4 is connected to the output of the current generator IGEN and to the node ND2. The source terminal of this transistor is connected to the drain terminal of the transistor TN5 the source terminal of which is connected to the ground. Moreover, the transistor TN5 has its gate terminal connected to its drain terminal (diode mounting).

The signal ERAMP is applied to the gate terminals of the transistors TP1, TN2 through the follower FW, which supplies a signal ERAMP' of voltage 0 or Vx (logic 1). The signal ERAMP is also applied to the gate IV2 which supplies a signal Vpull the voltage level of which is 0 or Vx depending on the logic value of the signal ERAMP. The signal Vpull is applied to the gate terminals of the transistors TN4 and TN3. Finally, the gate terminal of the transistor TN1 is controlled by the node ND3.

The operation of the generator RAMPGEN between the instants tRAMP and tSET is shown on FIGS. 11A to 11E which respectively represent the signal ERAMP', the signal Vpull, the voltage Vc (node ND2), the voltage Vg (node ND3) and the output voltage VDR (node ND1). Before the instant tRAMP, the signal ERAMP' is on 0 and the signal Vpull is on 1 (Vx). The transistor TP1 is on and the output voltage VDR is equal to Vx. The capacitor Cr is charged, the transistors TN4 and TN5 are on and the node ND2 (voltage Vc) is linked to the ground. When the signal ERAMP changes to 1, the signal ERAMP' changes to 1 and the signal Vpull changes to 0. The transistors TP1, TN3 and TN4 turn off, the transistor TN2 becomes on and the node ND2 (voltage Vc) starts charging with a current imposed by the current generator IGEN. When the voltage ramp appearing on the node ND2 reaches the threshold voltage of the transistor TN1, at an instant tRAMP+ε, the transistor TN2 copies the voltage ramp on the node ND3 and the transistor TN1 gradually becomes on, such that the capacitor Cr gradually discharges. The output voltage VDR starts decreasing in inverse proportion to the voltage ramp on the node ND2, and forms a decreasing voltage ramp. When the voltage VDR (copied by the signal VPULSE) becomes equal to Vref and the circuit LCT resets the signal ERAMP to 0, the signal ERAMP' changes back to 0 and the transistor TP1 becomes on again, such that the output voltage VDR becomes equal to Vx again.

FIG. 12 represents an example of an embodiment of a word line driver DRV, for example the driver DRVi of the word line WLi represented in FIGS. 5 and 7, all the word line drivers having the same structure. The driver DRVi supplies the word line WLi with a control pulse VPULSEi upon receiving the control signal VPULSE and the signal EPULSE supplied by the circuit CONTCT.

The driver DRVi comprises inverter gates IV3, IV4, IV5 electrically powered by the voltage Vx, an output inverter gate IDRIVE, three NMOS transistors including a pull-up transistor TPU, a pull-down transistor TPD, and another pull-up transistor TAPU. The gate IDRIVE is formed by a PMOS-type transistor TDRIVE and an NMOS-type transistor TDOWN in series, the two transistors having their gate terminals interconnected. The transistor TDRIVE receives the control signal VPULSE at its drain terminal. Its drain terminal is linked to the drain terminal of the transistor TDOWN the source terminal of which is connected to the ground.

The gates IV3, and IV4 are head-to-tail connected to form a latch LDRIVE (volatile memory point). The input of this latch is linked to the input of the inverter gate IDRIVE as well as to the drain terminal of the transistor TPU and to the drain terminal of the transistor TAPU. The output of the latch is connected to the drain terminal of the transistor TPD. The source terminal of the transistor TPD is connected to the ground and the source terminal of the transistor TAPU receives the voltage Vx. The transistor TPU receives the word line selection signal SWLi at its source terminal (supplied by the decoder CDEC, cf. FIG. 5 or 7) and receives the signal EPULSE at its gate terminal. The transistors TPD and TAPU receive at their gate terminals the inverted signal /EPULSE supplied by the gate IV5.

The word line SWLi is selected by the decoder CDEC which sets the signal SWLi to 0. When the signal EPULSE is sent (e.g., changes to 1), the transistor TPU becomes on and forces the input of the latch LDRIVE and as a result the input of the gate IDRIVE to 0. The transistor TDRIVE becomes on and applies the control signal VPULSE to the word line. When the signal EPULSE changes back to 0, the signal /EPULSE changes to 1 and the transistors TPD and TAPU are on. The transistor TPD sets the output of the latch LDRIVE to 0 the input of which thus switches to 1. Simultaneously, the transistor TAPU ("Accelerated Pull Up Transistor") forces the input of the gate IDRIVE to 1 (e.g., the voltage Vx) to speed up its switching, without waiting for the state of the output of the latch to cause its input to switch. The gate IDRIVE thus changes to 0 very rapidly, including when the voltage Vx has just been applied to the word line. Thus, the transistor TDOWN becomes on very rapidly and pulls the word line WLi to 0, by rapidly discharging the stray capacitance of the word line. For this purpose, the transistor TDOWN has a gate width-to-length ratio (W/L) which is chosen according to the size of the stray capacitance of the word line, which depends on the length of the word line and on the number of selection transistors TS connected thereto (the stray gate-source capacitances of the transistors TS being added to the intrinsic stray capacitance of the word line).

It will be noted that, in the present embodiment, the driver DRVi is controlled by the signal EPULSE which marks both the beginning of a control pulse VPULSEi (by turning the transistor TDRIVE on) and the end of a pulse (by turning the transistor TDRIVE off and by simultaneously turning the transistor TDOWN on). In these conditions, the transistor TPULSE of the circuit CONTCT, described above in relation with FIG. 7, is not necessary since the beginning and the end of a pulse VPULSEi on the word line WLi are controlled by the transistor TDRIVE. If the transistor TPULSE is removed, the signal VPULSE is identical to the voltage VDR supplied by the generator RAMPGEN and is no longer a pulsed control signal.

The operation of the driver DRVi is shown in greater detail in FIGS. 13A to 13E in the aforementioned case in which the signal VPULSE is identical to the voltage VDR. FIGS. 13A to 13E respectively represent the selection signal SWLi, the signal EPULSE, the signal ERAMP, the signal VDR/PULSE, and the control pulse VPULSEi. The left-hand part of these figures shows the application of a programming pulse SPULSE to memory cells and the right-hand part of the figures shows the application of an erase pulse RPULSE, e.g., respectively the application of a pulse VPULSE(SET) and of a pulse VPULSE(RST) to the selection transistors TS. The signals shown only differ from those described above by the fact that the signal VPULSE is not temporally controlled by the signal EPULSE and that the temporal delimitation of the control pulses (beginning and end of the pulses) is only on the signal VPULSEi (effect of the transistor TDRIVE), both for the pulse VPULSE(SET) and the pulse VPULSE(RST).

Various alternative embodiments of the present invention are possible, particularly but not exclusively concerning the drivers DRV and the control circuit CONTCT. In particular, it results from the observations above that it is possible for the word line drivers not to be controlled by the signal EPULSE which marks the beginning and the end of a pulse VPULSE (RST) or VPULSE(SET), and be controlled only by the selection signals SWL (SWL0-SWLn). In this case, the transistor TPULSE (or any equivalent means) are kept in the circuit CONTCT to control the beginning and the end of the pulses VPULSE and the control signal VPULSE is a pulsed signal. In addition to the pulsed signal, the drivers only receive a signal which indicates the end of the pulses and which is applied collectively to all the drivers to make the transistor TDOWN on and to rapidly pull to 0 the word lines having received the voltage Vx.

Moreover, the circuit CONTCT can be divided into two distinct control circuits, one being equipped with the ramp generator and controlling the profile of the control pulses, the other being equipped with the timer and the voltage comparator and controlling the duration of the control pulses. The function of the comparator (determination of the end of the pulses VPULSE(SET)) can also be ensured by the timer if the slope of the voltage ramp is stable with the aging of the integrated circuit or according to the temperature.

The precise shape of the pulses RPULSE and SPULSE represented in FIGS. 3A, 3B and the corresponding shape of the control pulses VPULSE(RST) and VPULSE(SET) represented in FIGS. 3A, 6B may also be changed. In particular, it is possible for the pulse SPULSE and the corresponding control pulse VPULSE(SET) not to comprise the plateau time ranging from t0 to tRAMP. These pulses are then formed by a decreasing ramp only. In the circuit CONTCT represented in FIG. 7, the signal ERAMP is then sent at the same time as the signal EPULSE and it is no longer necessary for the timer TMR to supply the signal TRAMP.

As emphasized above, the memory array can be of the bit-erasable and -programmable type. In such an embodiment, the memory cells are erased or programmed individually and sequentially (one after the other). Bit writing may be preferred to word writing depending on the technological requirements of the design of the memory, particularly to avoid having to collect a significant resulting current equal to the sum of the erase and programming currents passing through each of the memory cells concerned upon the collective writing of all the memory cells of a word.

Various applications of embodiments of the present invention may be made and that the present invention is not limited to phase change memories. Although an embodiment of the present invention has been initially designed to meet the technical problem discussed in the background section above, the advantages of one embodiment the present invention can be sought with other types of memory cells, these advantages being to modulate a bit line voltage or current by the word lines, and to be able to apply to memory cells voltage or current signals of complex shape, some of which can have a very short quench time.

Generally speaking, one embodiment of the present invention relates to any type of integrated circuit comprising a memory, from the memories marketed in the form of integrated circuits to complex integrated circuits comprising a memory and various other elements using the memory, such as microcontrollers for example.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet, are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification, figures, Abstract, and the claims, but should be construed to include all possible embodiments along with the full scope of equivalents to which such claims are entitled. Accordingly, the claims are not limited by the disclosure.

What is claimed is:

1. An integrated circuit having a non-volatile memory, the integrated circuit comprising:
   a plurality of word lines;
   memory cells each including a memory point and a selection transistor having a control terminal connected to one of the word lines;
   a row decoder configured to supply word line selection signals;
   at least one voltage or current generator to supply the memory cells with an erase or programming voltage or current; and
   word line drivers interposed between the row decoder and the word lines, each word line driver being configured to cause the selection transistor of a selected memory cell of the memory cells to control an amplitude and a duration of an erase or programming voltage or current pulse applied to the memory point of the selected memory cell, the word line driver being configured to cause the selection transistor of the selected memory cell to control the amplitude and the duration of the erase or programming voltage or current pulse applied to the memory point of the selected memory cell by applying, on the word line coupled to the selected memory cell, a control pulse having a profile that corresponds to a profile of the erase or programming voltage or current pulse.

2. The integrated circuit according to claim 1, further comprising a control circuit configured to supply the word line drivers with a control signal having a profile that determines the profile of the control pulse.

3. The integrated circuit according to claim 2 wherein the control circuit comprises a ramp generator configured to give the control pulse a profile of a voltage ramp.

4. The integrated circuit according to claim 1 wherein the word line drivers each include a pull-down switch configured to rapidly pull a corresponding word line of the word lines down to a low level, at an end of the control pulse, by discharging a stray capacitance of the corresponding word line.

5. The integrated circuit according to claim 4 wherein the pull-down switch of each word line driver is configured to pull the corresponding word line down to the low level in a few nanoseconds after the corresponding word line has been biased with a maximal voltage that the word line driver can apply.

6. The integrated circuit according to claim 4, further comprising a control circuit configured to supply the word line drivers with a control signal to cause the word line drivers to end the control pulse.

7. The integrated circuit according to claim 4, further comprising a control circuit configured to supply the word line drivers with a control signal to cause the word lines drivers to begin and end the control pulse.

8. The integrated circuit according to claim 6 wherein each pull-down switch is configured to be controlled by the control signal, so as to pull the corresponding word line down to the low level in response to the control signal indicating that the control pulse should end.

9. The integrated circuit according to claim 7 wherein the word line decoder is configured to supply a selection signal to select one of the word line drivers and each word line driver is arranged to apply to the corresponding word line the control pulse in response to being selected by the word line decoder and in response to the control signal.

10. The integrated circuit according to claim 6 wherein each pull-down switch is a pull-down transistor of an inverter having a pull-up transistor configured to apply the control pulse to the corresponding word line.

11. The integrated circuit according to claim 10 wherein the inverter includes an input coupled to receive the control signal, and the inverter is configured to pull the corresponding word line down to the low level in response to the control signal indicating that the control pulse should end.

12. The integrated circuit according to claim 10, wherein the inverter is configured to:
   be controlled by the control signal and a word line selection signal;
   apply to the corresponding word line the control pulse in response to the control signal indicating that the control pulse should begin and in response to the word line selection signal indicating that the corresponding word line is selected; and pull the corresponding word line down to the low level in response to the control signal indicating that the control pulse should end.

13. The integrated circuit according to claim 10 wherein the word line drivers each include a pull-up switch configured to speed up change of an input of the inverter to a high state in response to the control signal indicating that the control pulse should end.

14. The integrated circuit according to claim 6 wherein:
the control circuit includes an isolating switch arranged between an output node of the control circuit and the word line drivers; and
the isolating switch is configured to be opened at an end of the control pulse, so as to isolate the output node of the control circuit in relation to the word line drivers.

15. The integrated circuit according to claim 1 wherein the memory point of each memory cell is a phase change memory point.

16. The integrated circuit according to claim 1, further comprising a plurality of bit lines, wherein the memory point of each memory cell is configured to receive the erase or programming voltage or current through a corresponding one of the bit lines, and is coupled to a low potential through the selection transistor of the memory cell.

17. The integrated circuit according to claim 1 wherein each selection transistor is a MOS transistor.

18. A method, comprising:
controlling erasing or programming memory cells each including a memory point and a selection transistor having a control terminal coupled to a word line, the controlling including:
applying an erase or programming voltage or current to the memory cells; and
causing the selection transistor of a selected memory cell of the memory cells to control an amplitude and a duration of an erase or programming voltage or current pulse applied to the memory point of the selected memory cell, the causing including applying, to the word line coupled to the selected memory cell, a control pulse having a profile which corresponds to a profile of the erase or programming voltage or current pulse applied to memory points.

19. The method according to claim 18, further comprising controlling the profile of the control pulse with a ramp generator to give the control pulse a profile of a voltage ramp.

20. The method according to claim 18, further comprising:
rapidly pulling the word line down to a low level at an end of one of the control pulses using a pull-down switch, by discharging a stray capacitance of the word line; and
putting the pull-down switch into an ON state at the end of the control pulse.

21. The method according to claim 20 wherein the pull-down switch pulls the word line down to the low level in a few nanoseconds after the word line has been biased with a voltage.

22. The method according to claim 20, wherein applying the control pulse to the word line using a word line driver that includes the pull-down switch, the method further comprising:
supplying the word line driver with a control signal that causes the pull-down switch to close and end the control pulse.

23. The method according to claim 22, wherein applying the control pulse includes applying the control pulse using a pull-up transistor of an inverter that includes the pull-down switch.

24. The method according to claim 23, further comprising controlling an input of the inverter with the control signal and a selection signal to select the word line, so as to:
apply the control pulse to the word line in response to the control signal indicating that the control pulse should begin and the selection signal indicating that the word line is selected; and
pull the word line down to the low level in response to the control signal indicating that the control pulse should end.

25. The method according to claim 18 wherein the memory points are phase change memory points.

26. The method according to claim 18 wherein the memory cell selection transistors are MOS transistors.

27. A system, comprising:
a memory that includes a plurality of word lines and memory cells each including a memory point and a selection transistor with a control terminal coupled to a corresponding one of the word lines;
a row decoder coupled to said memory and configured to supply word line selection signals; and
word line drivers, coupled between the row decoder and the word lines, each word line driver being configured to cause the selection transistor of a selected memory cell of the memory cells to control an amplitude and a duration of an erase or program voltage or current pulse applied to the memory point of the selected memory cell, the word line driver being configured to cause the selection transistor of the selected memory cell to control the amplitude and the duration of erase or program voltage or current pulse applied to the memory point of the selected memory cell by applying, on the word line coupled to the selected memory cell, a control pulse having a profile that corresponds to a profile of the erase or programming voltage or current pulse.

28. The system of claim 27 wherein said selection transistors are MOS transistors.

29. The system of claim 27 wherein said memory point of each memory cell is a phase change memory point.

30. The system of claim 27, further comprising at least one generator coupled to said memory cells and configured to supply said erase or programming voltage or current.

31. The system of claim 27, further comprising a control circuit coupled to said word line drivers and configured to supply the word line drivers with a control signal having a profile that determines the profile of the control pulses.

32. The system of claim 27 wherein the word line drivers each include a pull-down switch configured to rapidly pull a selected word line down to a low level, at an end of a control pulse, by discharging a stray capacitance of the word line.

33. An apparatus for erasing or programming memory cells each including a memory point and a selection transistor having a control terminal coupled to a word line, the apparatus comprising:
means for applying an erase or programming voltage or current to the memory cells; and
means for causing the selection transistor of a selected memory cell of the memory cells to control an amplitude and a duration of an erase or programming voltage or current pulse applied to the memory point of the selected memory cell, the means for causing including means for applying to the word line a control pulse having a profile which corresponds to a profile of the erase or programming voltage or current pulse applied to memory points.

34. The apparatus of claim 33, further comprising means for controlling the profile of the control pulse with a ramp generator to give the control pulse a profile of a voltage ramp.

35. The apparatus of claim 33, further comprising:
means for rapidly pulling the word line down to a low level at an end of the control pulse, by discharging a stray capacitance of the word line; and
means for putting the pull-down switch into an ON state at the end of the control pulse.

36. The apparatus of claim 33 wherein the memory point of each of said memory cells is a phase change memory point.

* * * * *